(12) United States Patent
Peters

(10) Patent No.: US 11,370,094 B2
(45) Date of Patent: Jun. 28, 2022

(54) DISASSEMBLY TOOL FOR ELECTROSTATIC CHUCK

(71) Applicant: GLOBALFOUNDRIES U.S. INC., Santa Clara, CA (US)

(72) Inventor: Nathan J. Peters, Delmar, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 141 days.

(21) Appl. No.: 16/829,181

(22) Filed: Mar. 25, 2020

(65) Prior Publication Data
US 2021/0299830 A1    Sep. 30, 2021

(51) Int. Cl.
*B25B 27/14*    (2006.01)
*H01L 21/683*   (2006.01)

(52) U.S. Cl.
CPC .......... *B25B 27/14* (2013.01); *H01L 21/6831* (2013.01)

(58) Field of Classification Search
CPC ....... B25B 27/00; B25B 27/02; B25B 27/023; B25B 27/14; Y10T 29/53796; Y10T 29/53683; Y10T 29/53704; Y10T 29/53848; Y10T 29/852; B23P 19/02; B23P 19/025; B23P 19/04; H01L 21/683; H01L 21/6831
USPC ......... 29/251, 252, 255, 259, 276, 278, 762; 269/143, 146, 246, 249, 266, 269
See application file for complete search history.

(56) References Cited

U.S. PATENT DOCUMENTS 5,781,977 A * 7/1998 Servones ............... B25B 27/023
                                                          29/259
7,102,871 B2 * 9/2006 Chang .................. C23C 16/4581
                                                          361/234

FOREIGN PATENT DOCUMENTS

CN            106956233 A  *  7/2017

OTHER PUBLICATIONS

CN-106956233 Machine Translation (Year: 2017).*

* cited by examiner

*Primary Examiner* — Lee D Wilson
*Assistant Examiner* — Alberto Saenz
(74) *Attorney, Agent, or Firm* — Francois Pagette; Andrew M. Calderon; Roberts Calderon Safran & Cole, P.C.

(57) ABSTRACT

The present disclosure relates to a tool for disassembling an electrostatic chuck assembly and, more particularly, to a tool for separating an electrostatic chuck and isolator and methods of use. The tool includes: a cradle having a sidewall; a pressing frame having legs which are positionable adjacent to the sidewall of the cradle and an upper connecting member connecting to each of the legs, the upper connecting member being positionable over a top of the cradle and having at least one opening; and at least one mechanism extending through the at least one opening of the pressing frame, the at least one mechanism being moveable to exert a downward pressure on an electrostatic chuck suspended within the cradle.

20 Claims, 3 Drawing Sheets

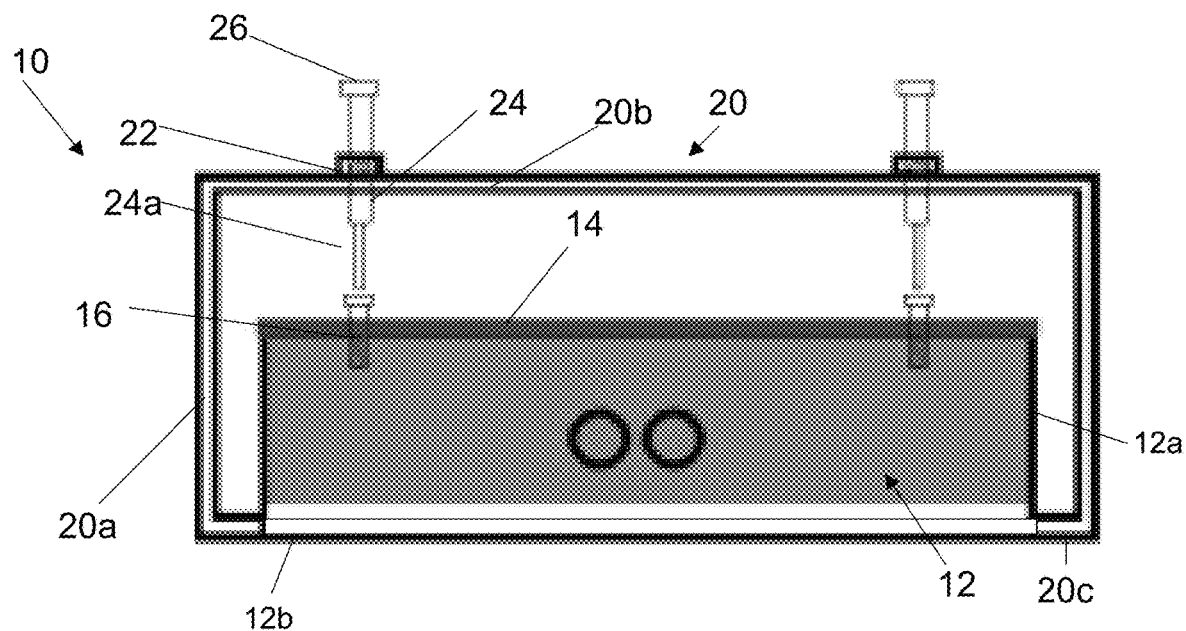
FIG. 3
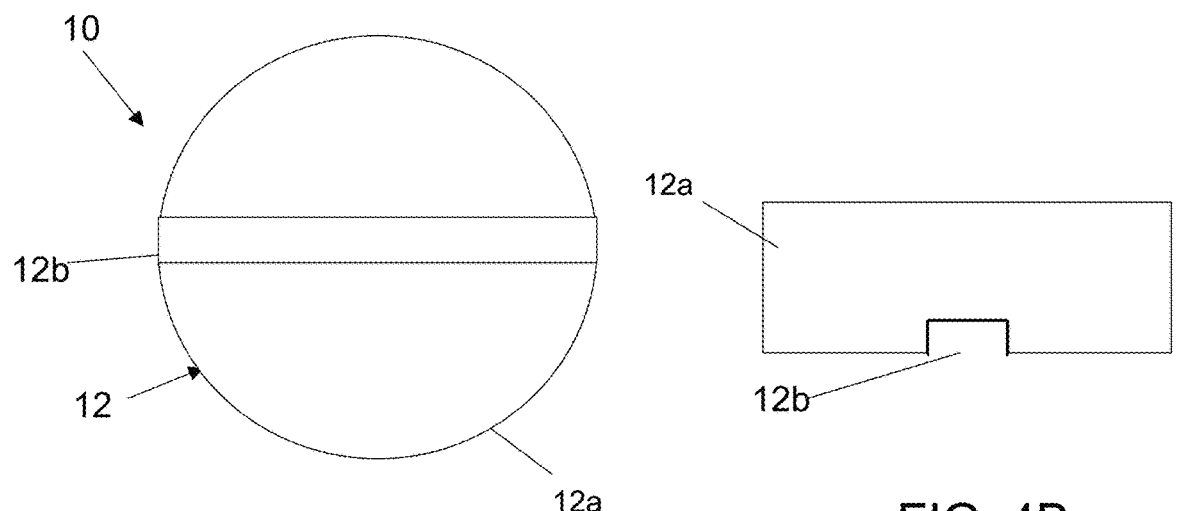
FIG. 4A
FIG. 4B

DISASSEMBLY TOOL FOR ELECTROSTATIC CHUCK

FIELD OF THE INVENTION

The present disclosure relates to a tool for disassembling an electrostatic chuck assembly and, more particularly, to a tool for separating an electrostatic chuck from an isolator and methods of use.

BACKGROUND

Electrostatic chucks (ESC) are used in semiconductor processes to hold a wafer during semiconductor manufacturing processing such as, e.g., high density plasma chemical vapor deposition (HDP-CVD) processes. The electrostatic chuck assembly typically includes a ceramic isolator that has high resistance to plasma and other gases used in the manufacture of the semiconductor devices. In use, the electrostatic chuck assembly also employs a platen with electrodes that are biased with a voltage to establish an electrostatic holding force between the platen and a semiconductor wafer.

However, the electrostatic chuck assembly is difficult to disassemble. Conventionally, a hammer is employed to separate the ceramic element from the platen. Specifically, a hammer is used to overcome the adhesive bond and separate the platen from the ceramic element. The ceramic element, however, is brittle and consequently the ceramic element is easily broken when it is subjected to such forces.

SUMMARY

In an aspect of the disclosure, a tool comprises: a cradle comprising a sidewall; a pressing frame having legs which are positionable adjacent to the sidewall of the cradle and an upper connecting member connecting to each of the legs, the upper connecting member being positionable over a top of the cradle and having at least one opening; and at least one mechanism extending through the at least one opening of the pressing frame, the at least one mechanism being moveable to exert a downward pressure on an electrostatic chuck suspended within the cradle.

In an aspect of the disclosure, a tool comprising: a cradle comprising a sidewall dimensioned and structured to hold an isolator thereon and to suspend an electrostatic chuck within an opening; a pressing frame having two vertical legs and an upper connecting member connecting to each of the vertical legs, the two vertical legs being positionable adjacent to the sidewall of the cradle and the upper connecting member having at least one threaded opening positioned over the cradle; and at least one screw threaded to the at least one threaded opening of the pressing frame, the at least one screw being moveable to exert a downward pressure on the electrostatic chuck suspended within the cradle and held to the electrostatic chuck by a static force.

In an aspect of the disclosure, a tool comprising: a cradle comprising a sidewall, a bottom and a channel at the bottom; a pressing frame comprising: two vertical legs; an upper connecting member connecting to each of the vertical legs at a first end; a lower connecting member connecting to each of the vertical legs at a second end and which is insertable into the channel; at least one threaded opening in the upper connecting member; and at least one screw threaded to the at least one threaded opening; and a push pin at the end of the at least one screw, the push pin exerts a downward pressure on the electrostatic chuck when the at least one screw is turned.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 3 shows a side view the disassembly tool with the isolator, amongst other features, in accordance with aspects of the present disclosure.

FIG. 4A shows a bottom view of a cradle in accordance with aspects of the present disclosure.

FIG. 4B shows a side view of the cradle in accordance with aspects of the present disclosure.

DETAILED DESCRIPTION

The present disclosure relates to a tool for disassembling an electrostatic chuck assembly and, more particularly, to a tool for separating an electrostatic chuck (e.g., platen) from an isolator and methods of use. More specifically, the present disclosure provides a tool comprising a cradle surrounded by a press used to separate the electrostatic chuck from a ceramic isolator for maintenance/rebuild. Advantageously, the tool allows for easy disassembly of the electrostatic chuck without the need for a hammer or any striking force, hence reducing damage to high value parts (e.g., ceramic isolator and platen) during the disassembly process.

By way of further advantages, the tool described herein will also reduce the time to rebuild a cathode of the electrostatic chuck during maintenance. For example, current separation time for components of the electrostatic chuck can take upwards of two (2) hours. In comparison, by using the tool described herein, such disassembly of the components of the electrostatic chuck assembly can be completed in about two (2) minutes, depending on the speed of the technician. Moreover, the use of the tool will create uniform maintenance practices for disassembly of the electrostatic chuck assembly; whereas, in current practices the components are pried, hammered or forced by hand to be separated.

In more specific embodiments, the tool is a disassembling device for separating a ceramic isolator from an electrostatic chuck (platen). In embodiments, the tool utilizes temporary screws threaded into the electrostatic chuck, which allow for application of a pressing force (instead of a striking force) to avoid ceramic damage of the ceramic isolator and other parts. In the assembly, a cradle fully supports the outer portion (e.g., edge) of the ceramic isolator and the electrostatic chuck is suspended in the cradle as described in more detail below.

Figure 1:
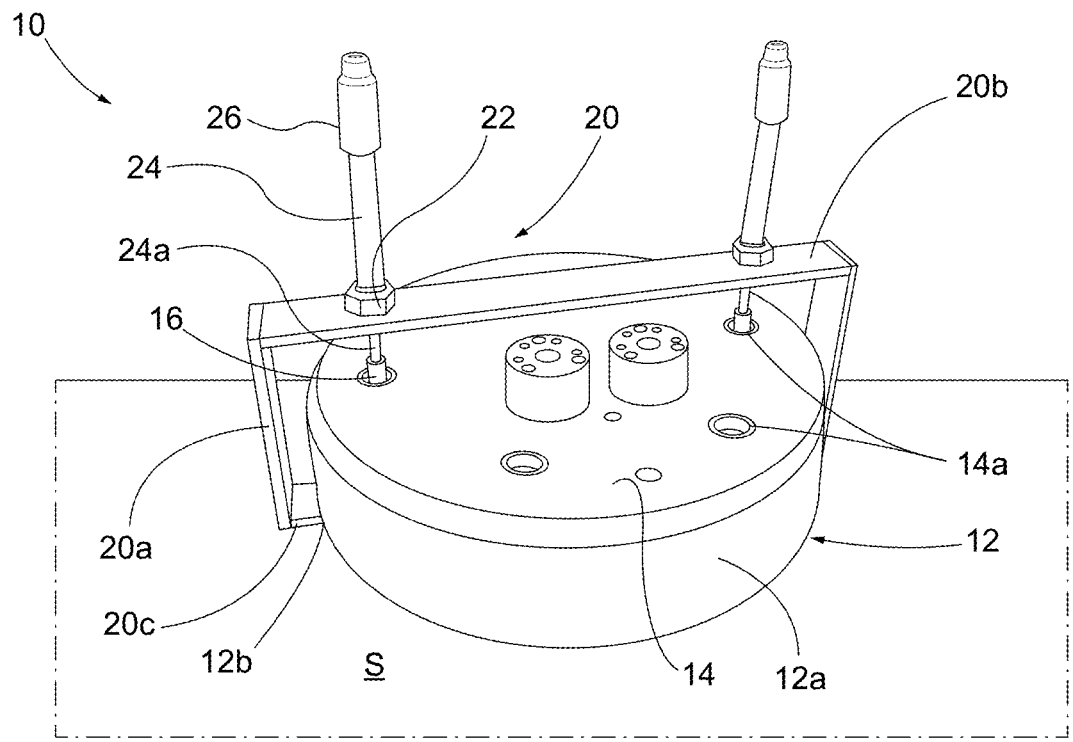
FIG. 1 shows a perspective view of a disassembly tool supporting an isolator, amongst other features, in accordance with aspects of the present disclosure.

FIG. 1 shows a perspective view of a disassembly tool, amongst other features, in accordance with aspects of the present disclosure. More specifically, the disassembly tool 10 includes a cradle 12 designed and structured to hold an isolator 14. In embodiments, the cradle 12 is composed of materials that can be used in a cleanroom of a semiconductor manufacturing facility. For example, the cradle 12 can be composed of different materials including Teflon, stainless steel, plastic(s) or other materials that can withstand certain pressing forces to separate an isolator 14 from an electrostatic chuck (platen). As is understood by those of ordinary skill in the art, the isolator 14 is a ceramic isolator in the shape of disc, for example.

Figure 2:
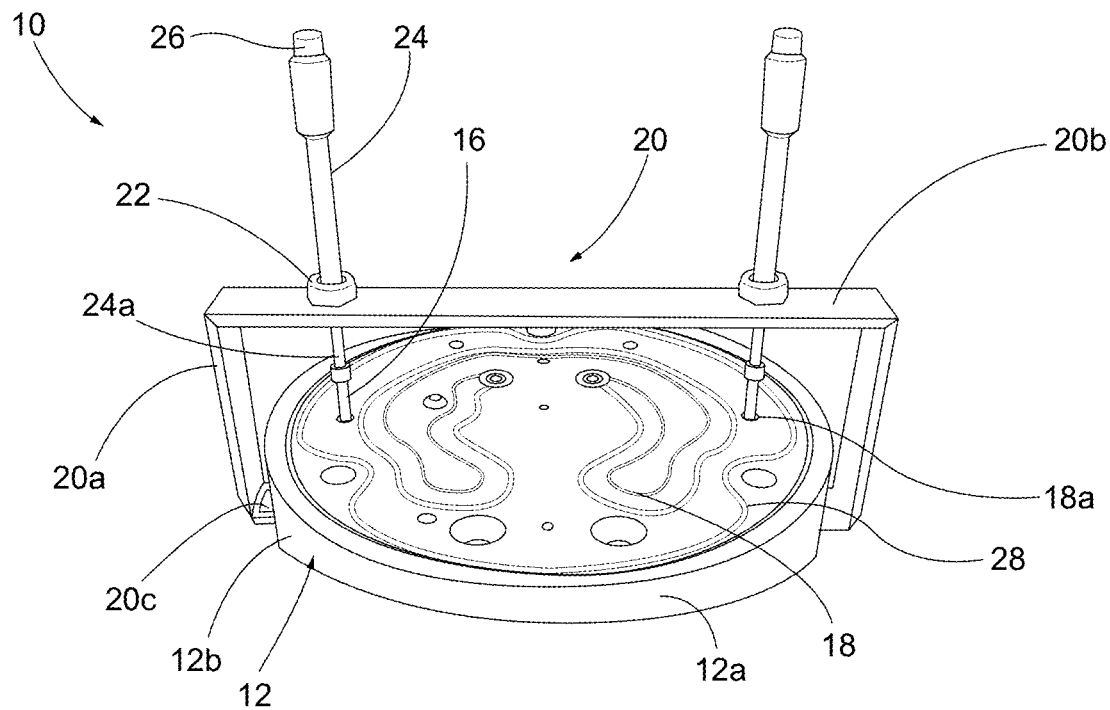
FIG. 2 shows a perspective view of the disassembly tool without the isolator, amongst other features, in accordance with aspects of the present disclosure.

Still referring to FIG. 1, the cradle 12 includes a vertical sidewall 12a with a diameter and/or circumference that is smaller than a diameter and/or circumference of the isolator 14. With such dimensions, the outer ring portion of the isolator 14 can rest on the vertical sidewall 12a of the cradle 12. That is, the cradle 12 will fully support the isolator 14, on its edge or outer circumference, on a top surface of the vertical wall of the cradle 12 during a disassembly process. Moreover, the isolator 14 includes a plurality of openings 14a which accommodate screws or other threaded or pin type mechanisms 16 (hereinafter referred generally as threaded or pin type mechanisms 16) that will engage with the electrostatic chuck 18 as shown in FIG. 2. In embodiments, the plurality of openings 14a will align with threaded holes 18a of the electrostatic chuck 18.

FIG. 1 further shows a pressing frame 20 extending over the cradle 12 and the isolator 14. In embodiments, the pressing frame 20 includes legs 20a extending on sides of the cradle 12 and an upper member 20b and a lower member 20c connecting to the legs 20a. In embodiments, the upper member 20b will extend over the isolator 14 and the lower member 20c will be under the cradle 12. In one example, the legs 20a are vertical legs 20a which are positioned adjacent to the sidewall 12a of the cradle 12 and the upper connecting member 20b extends over the combination of the cradle 12 and the isolator 14. The lower connecting member 20c is designed to be inserted into a channel 12b at the bottom of the sidewall 12a of the cradle 12 and, more preferably, on a bottom surface of the cradle 12. The lower connecting member 20c which is insertable into the channel 12b will not extend past a bottom surface of the cradle 12 and, preferably, will form a flat surface with the bottom surface of the cradle 12 such that the cradle 12 will sit flush on a work surface "S" during disassembly. Moreover, the lower connecting member 20c inserted into the channel 12b will ensure that the pressing frame 20 is properly aligned with the cradle 12 and the openings 14a of the isolator 14.

Still referring to FIG. 1, the pressing frame 20 includes threaded openings 22 that align with both the openings 14a of the isolator 14 and the threaded or pin type mechanisms 16. A screw or other threaded mechanism 24 (hereinafter referred generally as threaded mechanism(s) 24) is threaded into the threaded opening 22. A downwardly extending mechanism 24a, e.g., push pins 24a, extends from the threaded mechanism 24 and engages the threaded or pin type mechanisms 16.

In alternate embodiments, the threaded or pin type mechanisms 16 can be eliminated and the downwardly extending mechanism 24a can extend through the openings 14a of the isolator 14 and engage directly with the electrostatic chuck 18. In still further embodiments, the downwardly extending mechanism 24a can be eliminated in which case the threaded mechanism 24 will either contact directly with the electrostatic chuck 18 or with the threaded or pin type mechanisms 16 to apply a downward force.

The threaded mechanisms 24 can include a handle or head 26 which facilities the turning the threaded mechanisms 24 such that the push pins 24a engage and apply a downward pressure to the electrostatic chuck 18 and, more specifically, the threaded or pin type mechanisms 16 engaging or connected to the electrostatic chuck 18. The head 26, for example, can be used to accommodate a wrench, key or other tool designed to engage the head and turn the threaded mechanism 24.

FIG. 2 shows a perspective view of the disassembly tool 10 with the electrostatic chuck 18 disposed in an interior portion of the cradle 12 (without the isolator sitting on the cradle). More specifically, as shown in FIG. 2, the vertical sidewall 12a of the cradle 12 has a diameter and/or circumference that is larger than the diameter and/or circumference of the electrostatic chuck 18. In this way, the dimension of the cradle 12 allows the electrostatic chuck 18 to be suspended within the opening of the cradle 12. As should be understood by those of skill in the art, the electrostatic chuck 18 can be suspended within the opening of the cradle 12 by remaining attached to the isolator 14 by a static force.

As further shown in FIG. 2, the electrostatic chuck 18 includes threaded holes 18a, which accommodate the threaded or pin type mechanisms 16. The electrostatic chuck 18 further includes a gasket or o-ring 28, which contacts the underside of the isolator 14 (not shown in FIG. 2). Also, the push pins 24a are aligned with and apply a downward pressure to the threaded or pin type mechanisms 16. It should also be understood that although the present disclosure describes the use of two (2) push pins 24a and threaded or pin type mechanisms 16, 24, it should be understood that one or more push pins 24a and threaded or pin type mechanisms 16, 24 are contemplated herein.

FIG. 3 shows a side view of the disassembly tool 10, amongst other features. More specifically, FIG. 3 shows the isolator 14 resting on the sidewall 12a of the cradle 12. In addition, the pressing frame 20 extends over the cradle 12 and the isolator 14, with the lower connecting member 20c extending into the channel 12b of the cradle 12. In this embodiment, the channel 12b is at a bottom surface of the cradle 12, thereby allowing the cradle 12 to sit flush on a work surface. In embodiments, the channel 12b will not protrude through the bottom of the cradle 12.

FIG. 4A shows a bottom view of the cradle 12 and FIG. 4B shows a side view of the cradle 12. More specifically, both FIGS. 4A and 4B show the channel 12b on a bottom or underside of the cradle 12. The channel 12b will extend the diameter of the cradle 12. In this embodiment, the channel 12b will have such a depth and width to accommodate the lower connecting member 20c of the pressing frame 20, thereby allowing the cradle 12 to sit flush on a work surface. In embodiments, the channel 12b will not protrude through the bottom of the cradle 12.

Figure 5:
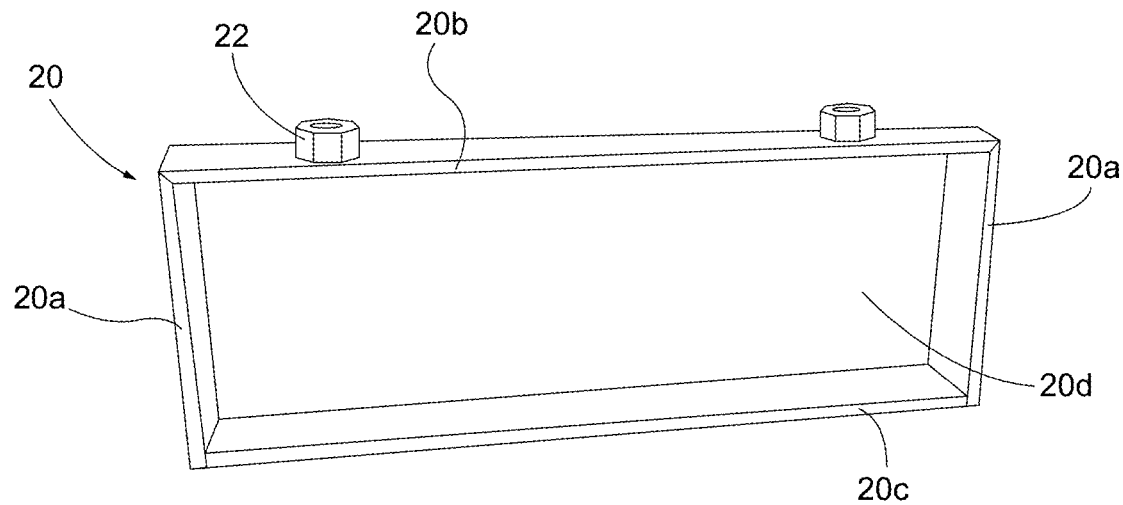
FIG. 5 shows a side view of a pressing frame in accordance with aspects of the present disclosure.

FIG. 5 shows a side perspective view of a pressing frame 20 in accordance with aspects of the present disclosure. As shown in this view, the pressing frame 20 is a one piece configuration in the shape of a rectangular, although the pressing frame 20 can be a square or other shape. In any scenario, the pressing frame 20 includes two vertical legs 20a connecting to the upper connecting member 20b and the lower connecting member 20c at opposing ends thereof. In this way, a hollow central portion 20d is provided between the members 20a, 20b, 20c, which is sized to accommodate the cradle 12 and the isolator 14, for example. The size and dimensions of the pressing frame 20 are also sized to ensure that the lower connecting member 20c fits flush into the channel 12b of the cradle 12. The upper connecting member 20b includes threaded openings 22 that align with both the openings 14a of the isolator 14 and the threaded or pin type mechanisms 16.

Figure 6:
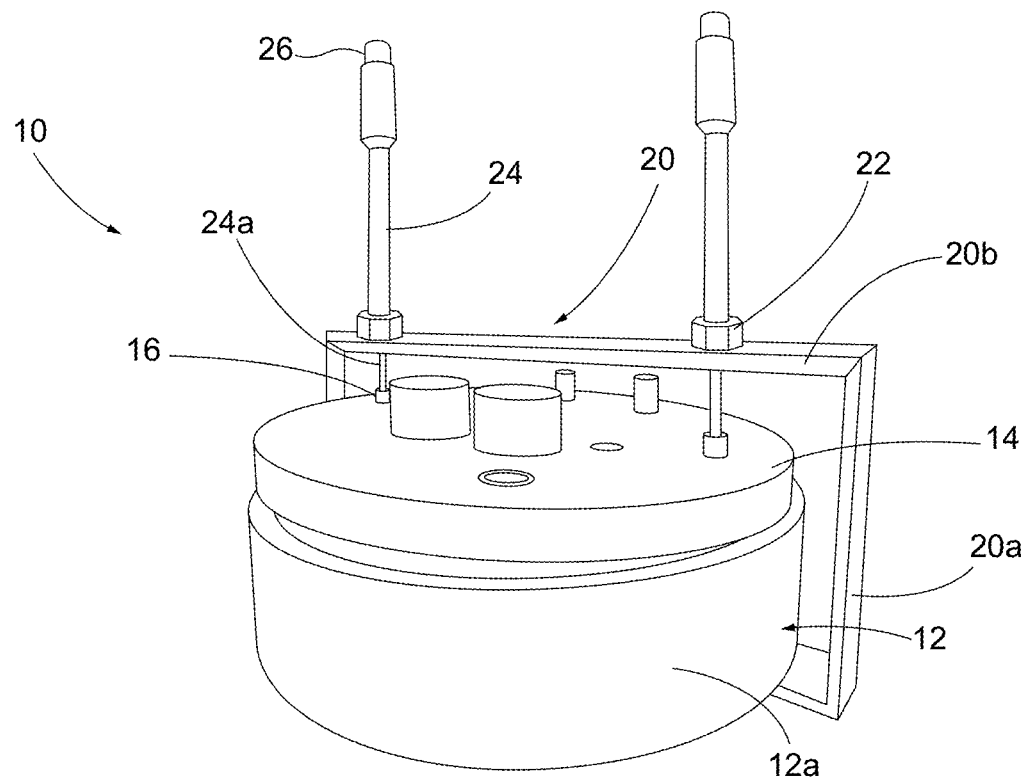
FIG. 6 shows a side view of the disassembly tool, amongst other features, in accordance with aspects of the present disclosure.

FIG. 6 shows a side view of the disassembly tool 10 being used to separate the isolator 14 from the electrostatic chuck 18. In this view, the isolator 14 is shown to be partially lifted from the cradle 12 and separated from the electrostatic chuck 18.

In use, the threaded or pin type mechanisms 16 are inserted through the openings 14a of the isolator 14, and engaged with the holes 18a of the electrostatic chuck 18 as shown in FIG. 2. The pressing frame 20 is positioned over the cradle 12 and the isolator 14, and the push pins 24a are aligned with the threaded or pin-type mechanisms 16. The lower connecting member 20c is also fitted into the channel 12b allowing the cradle 12 to sit flush on a work surface. The lower connecting member 20c and the channel 12b also assist in the alignment of the push pins 24a with the threaded or pin type mechanisms 16. The threaded mechanisms 24 are rotated such that the push pins 24a exert a downward pressure onto the threaded or pin type mechanisms 16. By exerting such downward pressure, the electrostatic chuck 18 will become separated from the isolator 14 due to the fact that the electrostatic chuck 18 will be pushed downward while the isolator 14 maintains its position on the sidewall 12a of the cradle 12. Once the electrostatic chuck 18 is separated from the isolator 14, the threaded or pin type mechanisms 16 can be removed from the electrostatic chuck 18 and the remaining portion of the disassembly tool 10 removed.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A tool, comprising:
a cradle comprising a sidewall;
a pressing frame having legs which are positionable adjacent to the sidewall of the cradle, an upper connecting member connecting to each of the legs, and a lower connecting member extending from the legs, the lower connecting member being positionable at a bottom of the cradle and the upper connecting member being positionable over a top of the cradle and having at least one opening; and
at least one mechanism extending through the at least one opening of the pressing frame, the at least one mechanism being moveable to exert a downward pressure on an electrostatic chuck suspended within the cradle.

2. The tool of claim 1, wherein the at least one mechanism is a set of screws, the at least one opening is two threaded openings and the set of screws are threaded into the two threaded openings.

3. The tool of claim 2, wherein each screw of the set of screws includes a downward extending push pin which engages a respective pin or threaded mechanism attached to the electrostatic chuck suspended within the cradle.

4. The tool of claim 1, wherein the cradle includes a channel.

5. The tool of claim 4, wherein the channel is at the bottom of the cradle.

6. The tool of claim 5, wherein the lower connecting member is insertable into the channel at the bottom of the cradle.

7. The tool of claim 6, wherein the lower connecting member does not extend into an opening of the cradle.

8. The tool of claim 1, wherein the sidewall of the cradle is dimensioned and structured to hold an isolator thereon and to suspend the electrostatic chuck within an opening of the cradle.

9. The tool of claim 8, wherein the at least one opening of the pressing frame is alignable with openings of the isolator.

10. A tool, comprising:
a cradle comprising a sidewall dimensioned and structured to hold an isolator thereon and to suspend an electrostatic chuck within an opening;
a pressing frame having two vertical legs, an upper connecting member connecting to each of the vertical legs, and a lower connecting member connecting at a lower end of the vertical legs and which is insertable at the bottom of the cradle, the two vertical legs being positionable adjacent to the sidewall of the cradle and the upper connecting member having at least one threaded opening positioned over the cradle; and
at least one screw threaded to the at least one threaded opening of the pressing frame, the at least one screw being moveable to exert a downward pressure on the electrostatic chuck suspended within the cradle and held to the electrostatic chuck by a static force.

11. The tool of claim 10, wherein the at least one screw is two screws and the at least one threaded opening is two threaded openings, and each screw includes a downward extending push pin which engages a respective pin or threaded mechanism attached to the electrostatic chuck suspended within the cradle.

12. The tool of claim 10, wherein the cradle includes a channel at a bottom of the cradle and the lower connecting member is insertable into the channel at the bottom of the cradle.

13. The tool of claim 12, wherein the lower connecting member does not extend into the opening of the cradle.

14. The tool of claim 12, further comprising temporary screws which extend through openings of the isolator and which are temporarily attach to the electrostatic chuck.

15. The tool of claim 14, wherein the at least one threaded opening of the pressing frame is alignable with the openings of the isolator.

16. A tool, comprising:
a cradle comprising a sidewall, a bottom and a channel at the bottom;
a pressing frame comprising:
two vertical legs;
an upper connecting member connecting to each of the vertical legs at a first end;
a lower connecting member connecting to each of the vertical legs at a second end and which is insertable into the channel;
at least one threaded opening in the upper connecting member; and
at least one screw threaded to the at least one threaded opening; and
a push pin at an end of the at least one screw, the push pin exerts a downward pressure on an electrostatic chuck when the at least one screw is turned.

17. The tool of claim 16, wherein the at least one screw is two screws, the at least one threaded opening is two threaded openings.

18. The tool of claim 16, wherein the lower connecting member is insertable into the channel and does not extend into the opening of the cradle.

19. The tool of claim 16, wherein the sidewall of the cradle has a circumference which is sized to hold an isolator thereon and to suspend the electrostatic chuck within an opening.

20. The tool of claim 19, further comprising temporary screws which extend through openings of the isolator and which are temporarily attach to the electrostatic chuck.

\* \* \* \* \*